United States Patent

Lin

[11] Patent Number: 6,004,859
[45] Date of Patent: Dec. 21, 1999

[54] METHOD FOR FABRICATING A STACK CAPACITOR

[75] Inventor: Dahcheng Lin, Hsinchu, Taiwan

[73] Assignee: Worldwide Semiconductor Manufacturing Corp., Taipei, Taiwan

[21] Appl. No.: 09/250,594

[22] Filed: Feb. 16, 1999

[30] Foreign Application Priority Data

Jan. 8, 1999 [TW] Taiwan ................................. 88100241

[51] Int. Cl.$^6$ .................................................. H01L 21/70
[52] U.S. Cl. .......................... 438/398; 438/253; 438/255; 438/964
[58] Field of Search ...................... 438/398, 253, 438/255, 396, 964, 665, FOR 220, FOR 430

[56] References Cited

U.S. PATENT DOCUMENTS

| | | | |
|---|---|---|---|
| 5,340,765 | 8/1994 | Dennison et al. | 438/398 |
| 5,438,011 | 8/1995 | Blalock et al. | 438/398 |
| 5,663,085 | 9/1997 | Tanigawa | 438/255 |
| 5,741,722 | 4/1998 | Lee | 438/396 |
| 5,907,773 | 6/1999 | Ikemasu et al. | 438/396 |

*Primary Examiner*—Charles Bowers
*Assistant Examiner*—Scott J. Hawranek
*Attorney, Agent, or Firm*—Thomas, Kayden, Horstemeyer & Risley

[57] ABSTRACT

A method for fabricating a stack capacitor with a hemispherical grain (HSG) structure is provided. A dielectric layer with a cave is first formed on a substrate. A conformal multi-layer amorphous silicon layer with low dopant concentration is formed over the substrate to cover the cave surface. An amorphous silicon layer with a sufficiently high dopant concentration is formed on the multi-layer amorphous silicon layer to fill the cave. After a planarization process, a remaining portion of the multi-layer amorphous silicon layer and the amorphous silicon layer form a storage node to fill the cave. The dielectric layer is removed to expose the storage node. A HSG is formed on the exposed surface of the storage node. An annealing process is performed to obtain a uniform dopant concentration. A dielectric thin film is formed over the storage node and the HSG layer. An upper electrode is formed to accomplish the stack capacitor.

15 Claims, 3 Drawing Sheets

METHOD FOR FABRICATING A STACK CAPACITOR

CROSS-REFERENCE TO RELATED APPLICATION

This application claims the priority benefit of Taiwan application serial no. 88100241, filed Jan. 8, 1999, the full disclosure of which is incorporated herein by reference.

BACKGROUND OF THE INVENTION

1. Field of the Invention

This invention relates to semiconductor fabrication, and more particularly to a method for fabricating a stack capacitor with a hemi-spherical grain (HSG) structure.

2. Description of Related Art

A semiconductor memory, such as a dynamic random access memory (DRAM), typically includes a transistor and a capacitor. Quality of a memory does strongly depend on performance of both the transistor and the capacitor. Intentions to improve the semiconductor memory are concentrated on how to improve abilities of the transistor and the capacitor.

As semiconductor fabrication technology achieves a deep sub-micron level, device dimension is greatly reduced. For a memory structure, as the structure dimension is reduced, it means that the capacitor dimension is also reduced, causing a smaller capacitance. On the other hand, since the computer application software size also increases a lot, it needs to be supported by a large number of memory cells. It becomes a trend to reduce the memory dimension to satisfy the need of software. In this situation, it is a challenge to fabricate a greatly reduced memory dimension with sufficient capacitance.

Currently, there are two main considering points to improve capacitance with reduced dimension. One is using a dielectric material with high dielectric constant K, and the other one is increasing the capacitor surface. The dielectric material with high dielectric constant includes, for example, tantalum oxide ($Ta_2O_5$) with K about equal to 25 or Barium titanate ($BaTiO_3$) with K even as high as about 1000.

About the solution of increasing the capacitor surface, there are also two main methods. One is called a deep-trench type and the other one is called a stack type. The deep-trench capacitor typically includes a trench with a depth of about 6–7 microns. After filling the deep trench with a dielectric material, a deep-trench capacitor is formed. The deep-trench capacitor can have a large capacitance but it is difficult to be formed. The deep-trench capacitor may be a main trend in the future but not now.

The stack-type capacitor is the main type for the current fabrication trend. Since the stack-type capacitor still has its advantages, semiconductor manufacturers, such as NEC company in Japan or Sumsung company in Korea, have made a lot of efforts to develop a memory device with few mega bits of memory cells at a fabrication level less than 0.25 microns. In this manner, the HSG technology is one of the main technologies being used.

FIGS. 1A–1C are cross-sectional views, schematically illustrating a conventional fabrication process to form a stack capacitor.

In FIG. 1A, an amorphous silicon layer 102 formed over a substrate 100. The substrate 100 includes a semiconductor substrate 101, an oxide layer 104 on the semiconductor substrate 101, and a conductive plug 104 in the substrate 100 serving as a lower electrode of a capacitor. The conductive plug 104, for example, is a Si plug 104.

The amorphous silicon layer 102 is formed by low pressure chemical vapor deposition (LPCVD) at a temperature of 520° C. for 13 hours so as to obtain a thickness of 6000 angstroms. During the formation of the amorphous silicon layer 102, phosphorous ions are in-situ doped. The dopant concentration is about $2 \times 10^{20}$ atoms/cm$^3$.

In FIG. 1B, the amorphous silicon layer 102 is patterned to form a storage node 102a, which is a remaining portion of the amorphous silicon layer 102 covering the Si plug 14. A HSG layer 108 is formed over an exposed surface of the storage node 102a. The formation of the HSG layer 108 includes performing a seeding process at an ultra high vacuum environment with silane ($SiH_4$) gas. A large number of HSG crystal nuclei are formed on the exposed surface of the storage node 102a. Then, still at the high vacuum environment, a thermal process is performed so as to allow the silicon atoms of the storage node 102a to be migrated to the HSG nuclei. As a result, the HSG layer 108 is formed on the exposed surface of the storage node 102a. The HSG layer produces more charge storage surface.

In FIG. 1C, a capacitor dielectric layer 110 conformal to the surface of the storage node 102a and the HSG layer 108 is formed by LPCVD. The capacitor dielectric layer 110 includes silicon oxide or a structure of silicon-oxide/silicon-nitride/silicon-oxide (O/N/O). A conductive layer 112 serving as an upper electrode of the capacitor is formed to cover the capacitor dielectric layer 110.

In this conventional method, it take long to form the amorphous silicon layer 102. The throughput is strongly affected. The amorphous silicon layer 102 may also be easily converted to a polysilicon structure, causing difficulty to form the HSG layer 108.

Moreover, since the dopant concentration in the amorphous silicon layer 102 is not sufficiently large, an undoped silicon film may often form on the surface of the HSG layer 108 while the HSG layer is formed. The undoped silicon film causes a capacitance depletion effect. Usually, the capacitance is degraded by about 15% if the undoped silicon film occurs.

Even though the capacitance depletion effect can be reduced by increasing the dopant concentration in the storage node 108, the silicon atom migration performance is degraded. It becomes more difficult to form the HSG layer.

SUMMARY OF THE INVENTION

It is at least an objective of the present invention to provide a method for fabricating a stack capacitor. A hemi-spherical grain (HSG) layer can be easily formed without capacitance depletion effect. It also take less time to form a storage node so that the throughput is effectively increased.

In accordance with the foregoing and other objectives of the present invention, an improved method for fabricating a stack capacitor with a HSG layer is provided. The improved method includes forming a first dielectric layer over a substrate. A cave is formed by patterning the first dielectric layer. The cave exposes a portion of the substrate. A conformal multi-layer amorphous silicon layer, each with different dopant concentration, is formed over the substrate so as to also cover the cave. A first amorphous silicon layer with a first dopant concentration is formed over the multi-layer amorphous silicon layer so as to also fill the cave. Performing a planarization process, a portion of the first and the multi-layer amorphous silicon layers are removed so that a remaining portion just fills the cave to form a storage node, and the first dielectric layer is exposed. The first dielectric layer is removed so as to expose the storage node, which includes the remaining portion of the first amorphous silicon layer and the second amorphous silicon layer. A HSG layer is formed over an exposed surface of the storage node. An annealing process is performed so as to obtain a more uniform dopant concentration on the multi-layer amorphous silicon layer, the first amorphous silicon layer and the HSG layer, all of which serve together as a main part of a lower electrode of the stack capacitor. A second dielectric layer serving as a capacitor dielectric layer is formed over the storage node and the HSG layer with a conformal structure. A conductive layer is formed over the storage node and the HSG layer to serve as an upper electrode of the stack capacitor.

In the foregoing, the multi-layer amorphous silicon layer includes, for example, a single second amorphous silicon layer, which is undoped or lightly doped. A third amorphous silicon layer doped by a second dopant concentration can be further included to form a two-layer structure. The multi-layer amorphous silicon layer can even further includes an undoped fourth amorphous silicon layer to form a tree-layer structure.

In the invention, the cave is pre-formed. The multi-layer amorphous silicon layer and the first amorphous silicon layer are sequentially formed to fill the cave so as to serve as the storage node. This reduces the formation time.

In the invention, the annealing process allows the dopant with different concentration to be diffused so as to effectively achieve a uniform dopant concentration in the lower electrode.

In the invention, the storage node is directly formed on a surface of the cave so that a formation time of the storage node is effectively reduced. For a square storage node as an example, the invention can reduce the formation time by about a factor of two. The throughput is effectively increased.

In the invention, since the formation time of the storage node is greatly reduced, the amorphous structure has a smaller probability to be converted into a polysilicon structure. The HSG layer therefore can be more easily formed.

In the invention, the multi-layer amorphous silicon layer with low dopant concentration is helpful to form the HSG layer.

In the invention, the first dopant concentration of the first amorphous silicon layer has sufficiently high concentration so that doped dopants can be evenly diffused to the HSG layer. A capacitance depletion effect conventionally occurring on a surface of the HSG layer is effectively reduced.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIGS. 2A–2F are cross-sectional views of a portion of a substrate, schematically illustrating a fabrication process to form a stack capacitor, according to a preferred embodiment of the invention.

Figure 1A:
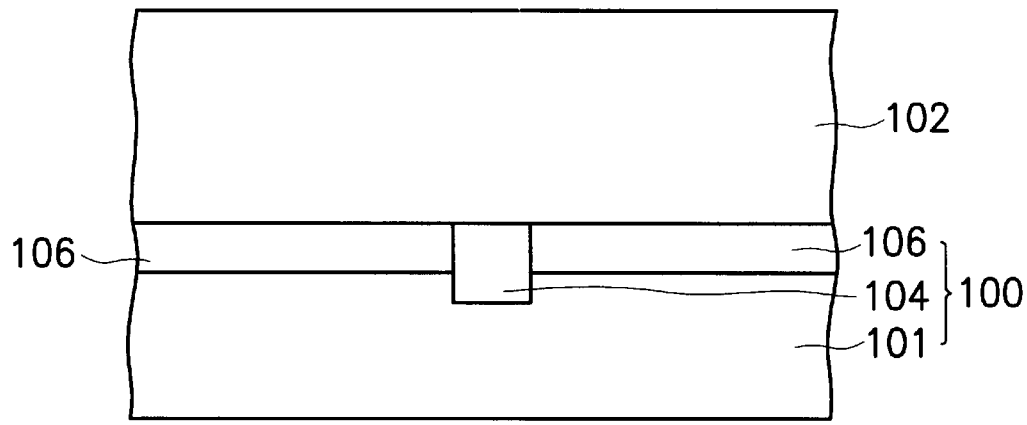
FIGS. 1A–1C are cross-sectional views of a portion of a substrate, schematically illustrating a conventional fabrication process to form a stack capacitor.
Figure 1B:
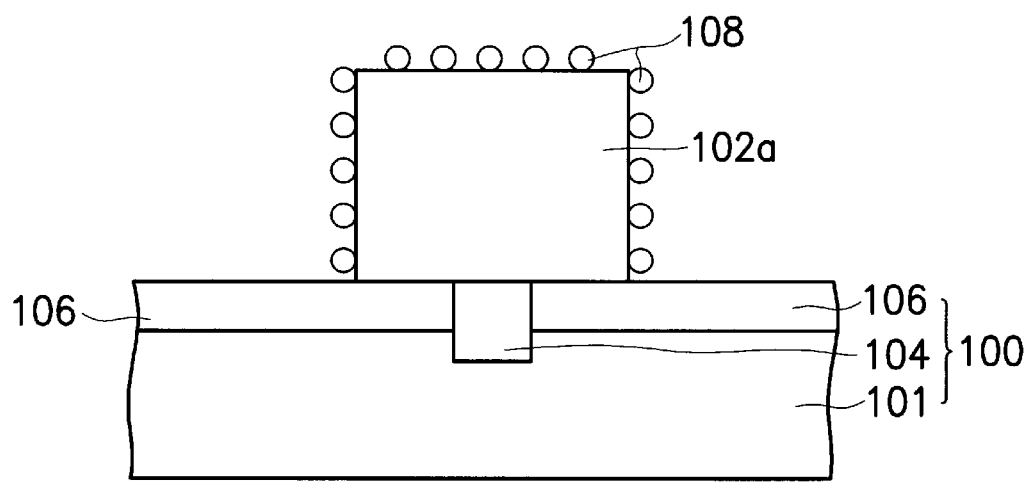
Figure 1C:
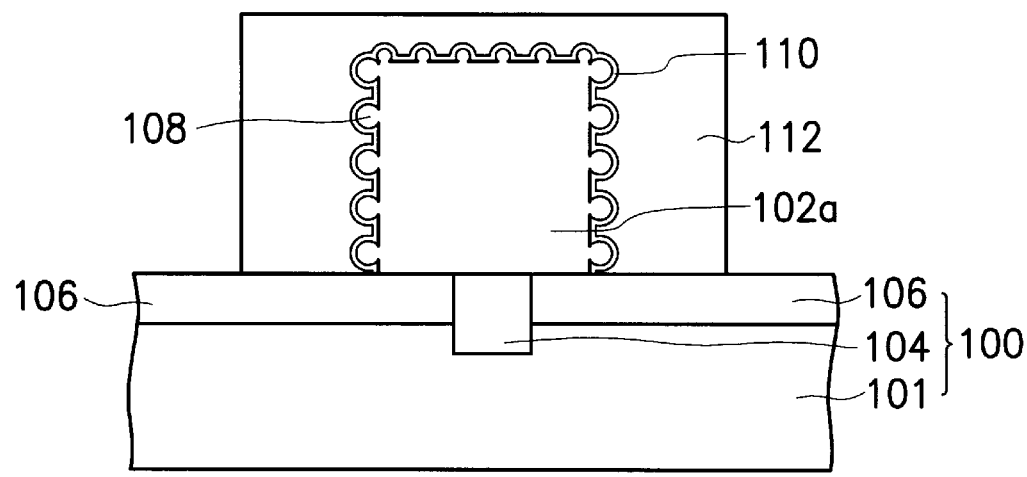
Figure 2A:
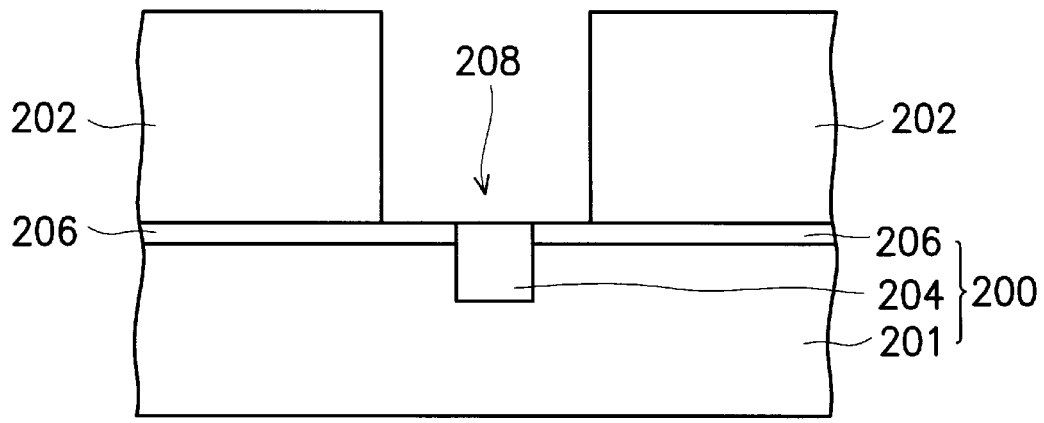
FIGS. 2A–2F are cross-sectional views of a portion of a substrate, schematically illustrating a fabrication process to form a stack capacitor, according to a preferred embodiment of the invention.

In FIG. 2A, a dielectric layer 202 is formed on a substrate 200, which includes, for example, an etching stop layer 206 on a semiconductor substrate 201 and a conductive layer 204 in the substrate 200 to serve as a lower electrode of a capacitor that is to be gradually formed. The conductive layer 204 includes, for example, a silicon plug 204, which is, for example, properly coupled to a circuit (not shown) formed in the substrate 200. Using the etching stop layer 206 as an etching stop point, the dielectric layer 202 including, for example, silicon oxide is patterned by, for example, photolithography and etching so as to form a cave 208. The cave 208 exposes the conductive layer 204. The etching stop layer 206 includes, for example, silicon nitride. The formation of the dielectric layer 204 includes, for example, chemical vapor deposition (CVD), such as low pressure CVD (LPCVD).

The depth of the cave 208 depends on a thickness of the dielectric layer 202 and a desired surface for storing charges. It includes, for example, a width of about 6000–10000 angstroms.

Figure 2B:
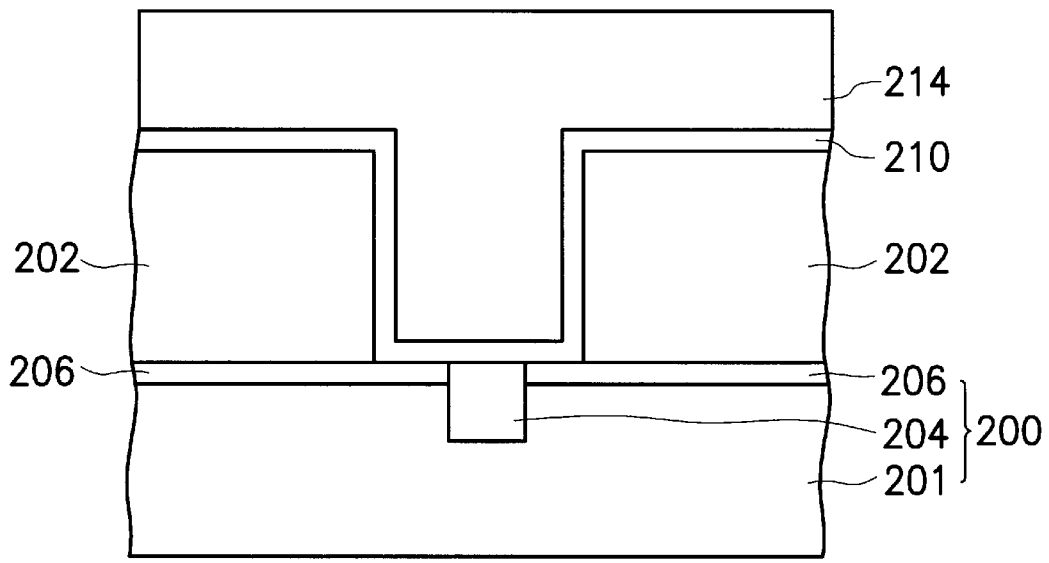

In FIG. 2B, a conformal multi-layer amorphous silicon layer 210 is formed over the substrate 200 by, for example, LPCVD, in which the multi-layer structure means that at least one sub-layer is included and each sub-layer has different dopant concentration. For example, the multi-layer amorphous silicon layer 210 can be a single-layer structure including a single amorphous silicon layer being lightly doped or undoped, a two-layer structure by including one additional lightly-doped amorphous silicon layer, or a tree-layer structure by further including one more undoped amorphous silicon layer. In principle, the multi-layer amorphous silicon layer 210 can include several sub-layers, each of which is undoped or lightly doped without a special sequence. The lightly-doped amorphous silicon layer include a small dopant concentration, such as a range about between $2 \times 10^{19}$–$2 \times 10^{20}$ atoms/cm$^3$. The total thickness of the multi-layer amorphous silicon layer 210 is, for example, about 400–1000 angstroms. The dopants include, for example, phosphorus ions. Generally, the multi-layer amorphous silicon layer 210 includes a small thickness and a light dopant concentration. The light dopant concentration is helpful for forming a HSG layer as to be described later.

An amorphous silicon layer 214 with a thickness of, for example, about 2000 Å is formed on the multi-layer amorphous silicon layer 210 so that the cave 208 of FIG. 2A is also filled. The formation of the amorphous silicon layer 214 includes, for example, LPCVD. The amorphous silicon layer 214 is doped with a dopant concentration of about $5 \times 10^{20}$ atoms/cm$^3$ or greater as high as its saturated concentration.

The saturated concentration means a maximum concentration for a doping process at an operation temperature. The saturated concentration therefore varies with the operation temperature. For example, if the operation temperature is at 520° C. for a doping process, the saturated concentration is about $6.5 \times 10^{20}$ atoms/cm$^3$. The saturated concentration usually decreases as the operation temperature increases.

The multi-layer amorphous silicon layer 210 with low dopant concentration is very helpful to grow the HSG structure in the subsequent process, and the amorphous silicon layer 214 with great dopant concentration can effectively avoid the capacitance depletion effect. The thickness of the multi-layer amorphous silicon layer 210 provides a barrier effect to prevent the dopants of the amorphous silicon layer 214 from diffusing onto the outer surface of the multi-layer amorphous silicon layer 210. So, the growth of the HSG structure is not affected.

An actual dopant concentration of the multi-layer amorphous silicon layer 210 can be freely adjusted in accordance with an actual operation.

Figure 2C:
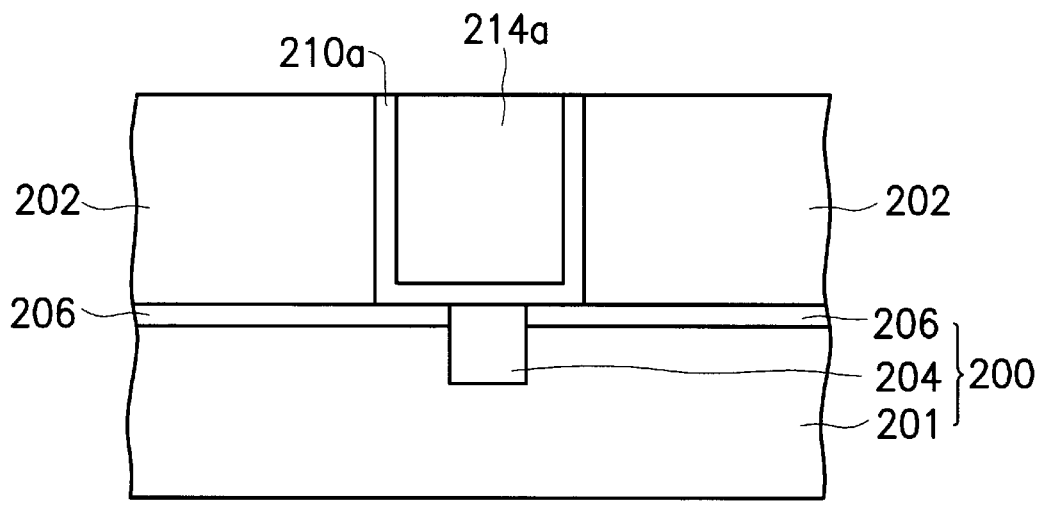

In FIG. 2C, a top portion of the multi-layer amorphous silicon layer 210 and the amorphous silicon layer 214 above the dielectric layer 202 is removed by, for example, a planarization process. The planarization process includes, for example, a chemical mechanical polishing (CMP) process or an etching back process with, for instance, reactive ion etching (RIE). Remaining portions filling in the cave 208 of FIG. 2A including a multi-layer amorphous silicon layer 210a and an amorphous silicon layer 214a serve together as a storage node.

Figure 2D:
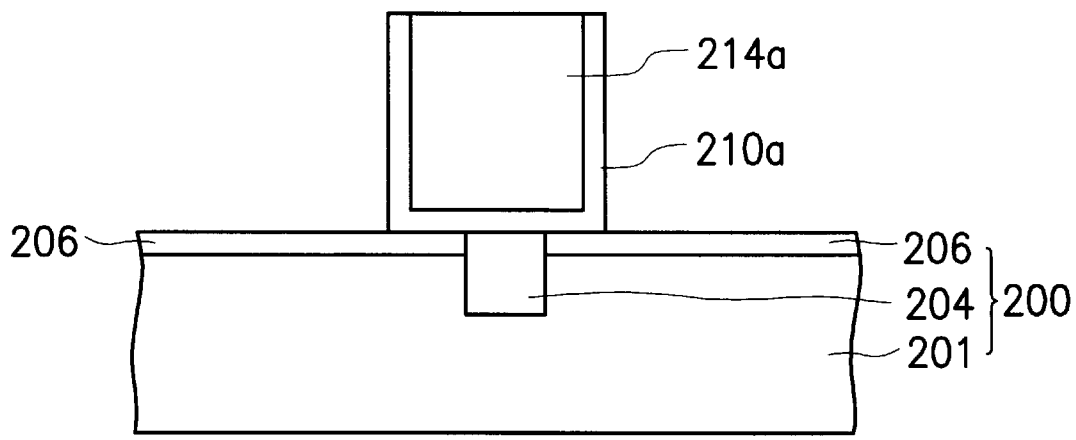

In FIG. 2D, the dielectric layer 202 is removed by, for example, dry etching. The etching stop layer 206 is used as an etching stop point. As a result, the storage node is exposed, in which each side surface of the multi-layer amorphous silicon layer 210a and the top surface are exposed.

Figure 2E:
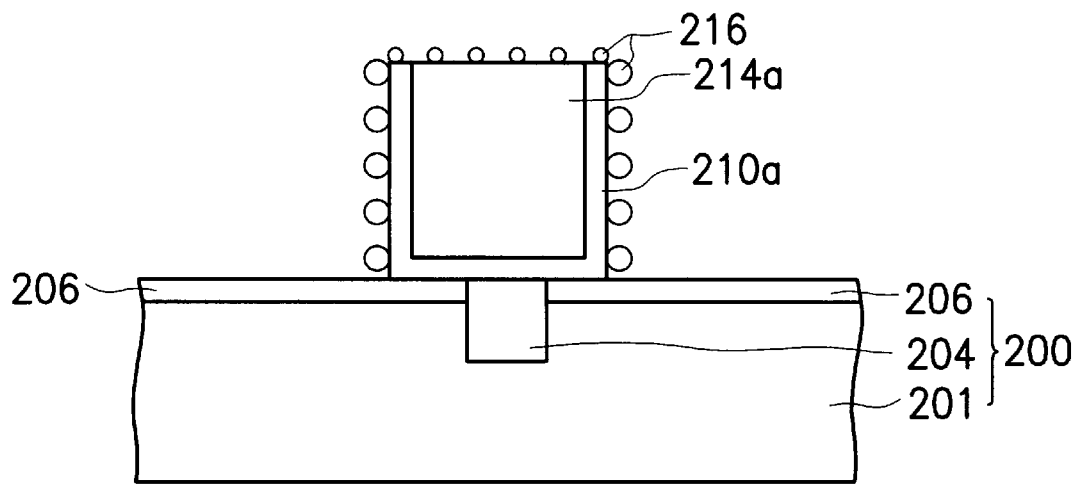

In FIG. 2E, a HSG layer 216 is formed on the exposed surface of the storage node. The formation of the HSG layer 216 includes, for example, performing a seeding process at a high vacuum environment with gas of silane ($SiH_4$) or di-silane $Si_2H_6$, to form HSG seeds and performing a thermal process at the same a high vacuum environment so that silicon atoms migrate from the storage node to the HSG seeds so as to form the HSG layer 216. Since the dopant concentration in the multi-layer amorphous silicon layer 210a and the amorphous silicon layer 214a are different, the HSG grain sizes on each layers are different. Since the multi-layer amorphous silicon layer 210a includes low dopant concentration, the HSG grain is well formed.

Figure 2F:
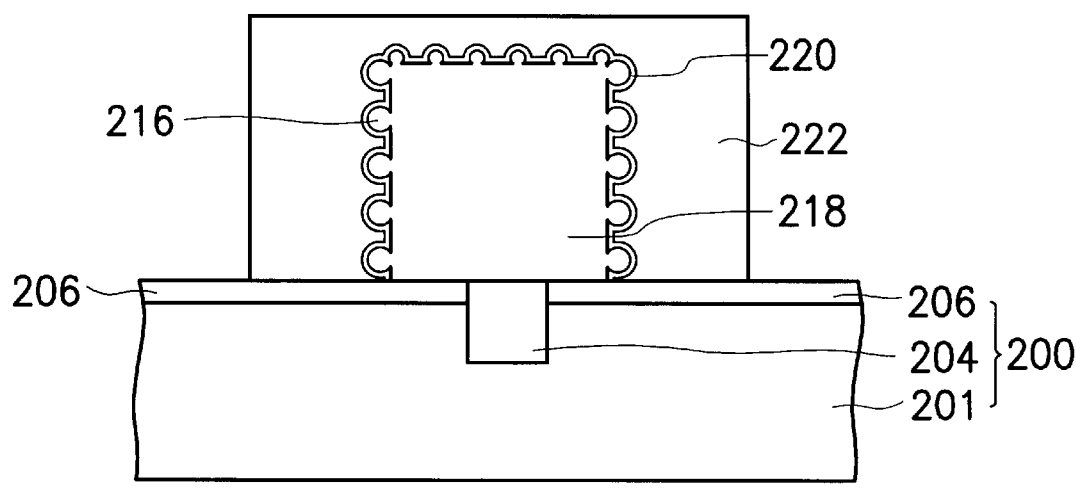

In FIG. 2F, an annealing process is performed so as to allow the dopants of the amorphous silicon layer 214a can be evenly diffused into the HSG layer 216 through the multi-layer amorphous silicon layer 210a. As a result, the amorphous silicon layer 214a, the multi-layer amorphous silicon layer 210a, and the HSG layer 216 have a uniform sufficiently large dopant concentration. The annealing temperature, for example, is about 800° C.–850° C., and the annealing duration is about 30–90 minutes. The conventional capacitance depletion effect is effectively avoided.

A capacitor dielectric layer 220 conformal to the storage node and the HSG layer 216 is formed. The formation of the capacitor dielectric layer 220 includes, for example, LPCVD. The capacitor dielectric layer 220 includes, for example, silicon oxide, silicon-oxide/silicon-nitride/silicon-oxide (O/N/O), tantalum oxide ($Ta_2O_5$), or barium titanate ($BaTiO_3$).

A conductive layer 222 is formed over the storage node and the HSG layer 216 on the etching stop layer 206 so as to serve as an upper electrode of the stack capacitor.

In the invention, the cave 208 is pre-formed. The multi-layer amorphous silicon layer 210 and the amorphous silicon layer 214 are sequentially formed to fill the cave 208 so as to serve as the storage node. This reduce the formation time of the storage node.

In the invention, the annealing process allows the dopants with different concentration to be diffused so as to effectively achieve a uniform dopant concentration in the storage node and the HSG layer 216.

In the invention, the storage node 210a and 214a is directly formed in the cave 208 so that a formation time of the storage node is effectively reduced. For a square storage node as an example, the invention can reduce the formation time by about a factor of two. The throughput is effectively increased.

In the invention, since the formation time of the storage node 210a and 214a is greatly reduced, the storage node has a smaller probability to be converted into a polysilicon structure. The HSG layer therefore can be more easily formed.

In the invention, the multi-layer amorphous silicon layer 210a with low dopant concentration is very helpful to the formation of the HSG layer 216.

In the invention, the dopant concentration of the amorphous silicon layer 214a has sufficiently high concentration so that the doped dopants can be evenly diffused into the HSG layer 216. A conventional capacitance depletion effect occurring on the surface of the HSG layer is effectively avoided.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a stack capacitor on a substrate, the method comprising:

forming a first dielectric layer on the substrate;

patterning the first dielectric layer to form a cave that exposes a desired portion of the substrate;

forming a conformal multi-layer amorphous silicon layer over the substrate so as to at least cover the cave, wherein the multi-layer amorphous silicon layer comprises at least one sub-layer that is lightly doped or undoped;

forming a first amorphous silicon layer with a first dopant concentration over the substrate so that the cave is also filled, removing a top portion of the multi-layer amorphous silicon layer and the first amorphous silicon layer above the first dielectric layer so that a remaining portion of the multi-layer amorphous silicon layer and the first amorphous silicon layer fills the cave to serve as a storage node;

removing the first dielectric layer so as to further expose the storage node;

forming a hemi-spherical grain (HSG) layer on an exposed surface of the storage node;

performing an annealing process to allow dopants doped in the storage node to be fully diffused into the HSG layer so that a main part of a lower electrode of the stack capacitor is formed;

forming a second dielectric layer over the storage node and the HSG layer to serve as a capacitor dielectric film;

forming an upper electrode over the capacitor dielectric film so as to form the stack capacitor.

2. The method of claim 1, wherein the substrate further includes an etching stop layer on top, and a contact plug to have a proper electrical coupling to a circuit formed in the substrate.

3. The method of claim 2, wherein the etching stop layer comprises silicon nitride.

4. The method of claim 1, wherein the multi-layer amorphous silicon layer comprises a single second amorphous silicon layer that is undoped or lightly doped with a second dopant concentration.

5. The method of claim 4, wherein the multi-layer amorphous silicon layer further comprises a third amorphous silicon layer that is lightly doped by a second dopant concentration.

6. The method of claim 5, wherein the second dopant concentration is about $2 \times 10^{19} - 2 \times 10^{20}$ dopants/cm$^3$.

7. The method of claim 5, wherein the third amorphous silicon layer is between the first amorphous silicon layer and the second amorphous silicon layer.

8. The method of claim 5, wherein the multi-layer amorphous silicon layer further comprises a fourth amorphous silicon layer.

9. The method of claim 8, wherein the fourth amorphous silicon layer is undoped.

10. The method of claim 8, wherein the fourth amorphous silicon layer is between the first amorphous silicon layer and the third amorphous silicon layer.

11. The method of claim 1, wherein the first dopant concentration is about $5 \times 10^{20}$ dopants/cm$^3$ or greater as high as a saturated concentration.

12. The method of claim 1, wherein the step of removing the top portion of the multi-layer amorphous silicon layer and the first amorphous silicon layer comprises a chemical mechanical polishing (CMP) process.

13. The method of claim 1, wherein the step of removing the top portion of the multi-layer amorphous silicon layer and the first amorphous silicon layer comprises a reactive ion etching (RIE) process.

14. The method of claim 1, wherein the step of performing the annealing process comprises a temperature of about 800° C.–850° C.

15. The method of claim 1, wherein the step of performing the annealing process comprises a duration time of about 30–90 minutes.

* * * * *